United States Patent
Pai et al.

(10) Patent No.: US 6,410,447 B2
(45) Date of Patent: *Jun. 25, 2002

(54) PROCESS FOR REMOVING PHOTORESIST MATERIAL

(75) Inventors: Yuan-Chi Pai, Nantou Hsien; Lung-Yi Cheng, Taipei; Cheng-Che Li, Taitung Hsien; Wei-Chiang Lin, Hsinchu, all of (TW)

(73) Assignee: United Microelectronics Crop., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/231,537

(22) Filed: Jan. 14, 1999

(30) Foreign Application Priority Data

Nov. 26, 1998 (TW) ............................................. 87119485

(51) Int. Cl.⁷ ............................................. H01L 21/302
(52) U.S. Cl. ........................ 438/706; 438/710; 438/712
(58) Field of Search ................................. 438/706, 712, 438/710, 60, 59; 427/39, 74

(56) References Cited

U.S. PATENT DOCUMENTS

| | | | | |
|---|---|---|---|---|
| 4,746,535 A | * | 5/1988 | Fukaya et al. | 427/39 |
| 5,225,771 A | * | 7/1993 | Leedy | 324/158 |
| 5,268,245 A | * | 12/1993 | Chiulli | 430/7 |
| 5,480,810 A | * | 1/1996 | Wei et al. | 438/59 |
| 5,514,625 A | * | 5/1996 | Tsuji | 437/195 |
| 5,591,553 A | * | 1/1997 | Snelling | 430/46 |
| 5,858,620 A | * | 1/1999 | Ishibashi et al. | 430/313 |
| 5,994,027 A | * | 11/1999 | Kudo et al. | 430/273.1 |
| 6,054,254 A | * | 4/2000 | Sato et al | 430/322 |
| 6,267,122 B1 | * | 7/2001 | Guldi et al. | 134/1.3 |

OTHER PUBLICATIONS

Stanley Wolf and Richard Tauber, Silicon processing for the VLSI era, vol. 1, pp 427 and pp 518, 1986.*

* cited by examiner

Primary Examiner—Robert Kunemund
Assistant Examiner—Lan Vinh

(57) ABSTRACT

A process for removing photoresist material without any residues left and damage to the in-process substrate is described. The present process for removing photoresist on an in-process substrate comprises the steps of providing a cover layer which is to be etched on the in-process substrate and providing a layer of photoresist material thereon. The photoresist layer is patterned, exposed and developed. Then, the developed photoresist layer is further exposed without using a mask. The cover layer is etched with the use of the patterned photoresist layer. After etching, the photoresist material is removed by a solvent.

18 Claims, 1 Drawing Sheet

PROCESS FOR REMOVING PHOTORESIST MATERIAL

BACKGROUND OF THE INVENTION

1. Field of the Invention

This invention in general relates to a process for removing photoresist material and particularly, relates to a process for removing photoresist material in the manufacture of a CMOS (Complementary Metal-Oxide Semiconductor) photosensor.

2. Description of the Related Art

A charge-coupled device is conventionally used in a digital sensor. However, due to the cost and the size of the charge-coupled device, the CMOS photosensor has been recently developed.

A CMOS photosensor is electrically connected with other devices or other CMOS photosensors. A cover layer is used to protect and isolate the photosensitivity area in the substrate to prevent the electrical contact from the contact pad thereon. In such a case, the cover layer comprises a color filter layer for filtering a certain wavelength of light and a polyacrylate layer as a planarization layer or a protective layer for the color filter layer. However, since the properties of polyacrylate are similar to those of the photoresist material, it is difficult to remove the photoresist material by plasma without causing damage to the polyacrylate layer after formation of an opening on the metal pad by photolithography. Therefore, it is suggested that the layer of photoresist material be removed by a solvent.

The result of removing the photoresist material by a solvent depends on the etching machine, because the nature of the photoresist material changes after the ion-bombardment of plasma in the etching process so that the photoresist material cannot be sufficiently removed by a solvent. For example, after the etching process in a Tegal etching machine using low energy plasma, most of the photoresist material can be removed by a solvent, but some hairy photoresist residues still remain. In a TEL etching machine to perform the etching process on the wafer, due to the higher energy of the plasma, most of the photoresist material cannot be removed by a solvent after etching. If any photoresist material is left, the cover layer cannot maintain a planar form. In such a case, the light transmitted through the photosensor is interrupted, and the photosensitivity of the photosensor is thus decreased. Therefore, the complete removal of photoresist material on the cover layer in manufacturing a CMOS photosensor is desired, especially in industry-scale production.

SUMMARY OF THE INVENTION

It is therefore an object of the present invention to provide a process for removing photoresist material on an in-process substrate.

It is another object of the present invention to provide a process for manufacturing a CMOS photosensor with high photosensitivity.

To achieve the above objects and other advantages of the present invention, a process for removing photoresist material that leaves no residues and does not damage the in-process substrate is described. The present process for removing photoresist on an in-process substrate comprises the steps of providing a cover layer which is to be etched on the in-process substrate and providing a layer of photoresist material thereon. The photoresist layer is patterned, exposed and developed. Then, the developed photoresist layer is further exposed without using a mask. The cover layer is etched with the use of the patterned photoresist layer as a mask. After etching, the photoresist material is removed by a solvent.

In another aspect of the present invention, a process for manufacturing a CMOS photosensor with high photosensitivity is disclosed. The present process for manufacturing a CMOS photosensor with an in-process substrate having a metal pad for a subsequently formed electric connect comprises the steps of providing a cover layer which is to be etched on the in-process substrate and providing a layer of photoresist material thereon. The photoresist layer is patterned, exposed and developed. Then, the developed photoresist layer is further exposed without using a mask. The cover layer is etched with the patterned photoresist layer serving as a mask to form an opening on the metal pad. After etching, the photoresist material is removed by a solvent.

BRIEF DESCRIPTION OF THE DRAWINGS

Other objects, features, and advantages of the present invention will become apparent from the following detailed description of the preferred but non-limiting embodiments. The description is made with reference to the accompanying drawings in which.

DESCRIPTION OF THE PREFERRED EMBODIMENTS

Figure 1:
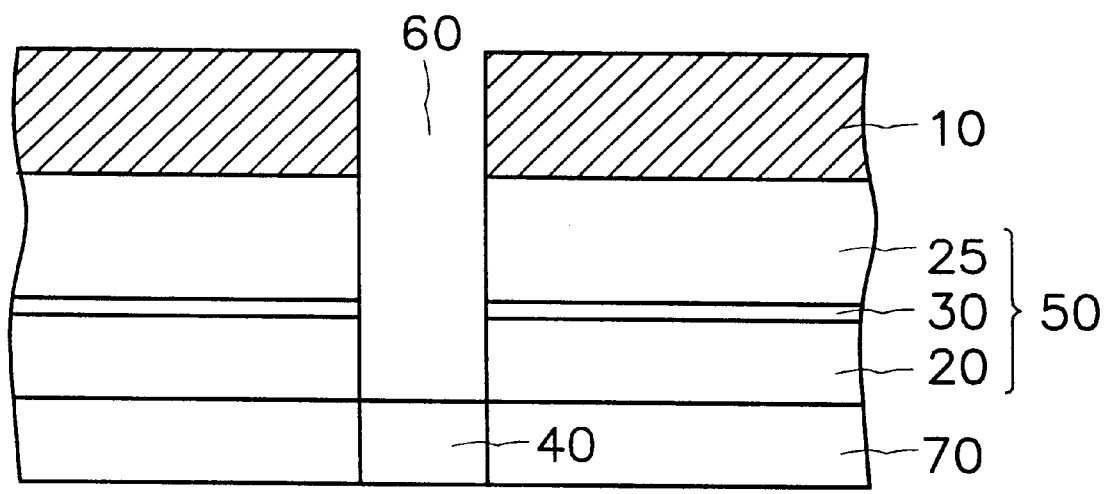
FIG. 1 schematically illustrates in cross-sectional representation one preferred embodiment of the cover layer on an in-process substrate of this invention.

The present invention describes a process for removing a photoresist material on a cover layer which is to be etched on an in-process substrate in manufacturing a CMOS photosensor. As referred to in FIG. 1, an in-process substrate with metal pad 40 for electrical connection is provided, wherein the designation 70 represents the photosensitivity area in the in-process substrate. A cover layer 50 is overlaid on the in-process substrate. In this embodiment of the present invention, the cover layer 50 comprises a first protective layer 20, a filter layer 30 and a second protective layer 25. The materials of the cover layer 50 should be light-transmissive. Preferably, the materials of the cover layer 50 are polyacrylate. Then, a positive photoresist 10 is formed on the cover layer 50. In this embodiment, no adhesion promoter is applied between the positive photoresist 10 and cover layer 50. The photoresist layer 10 is then patterned, exposed and developed.

After being patterned, exposed and developed, the remaining positive photoresist 10 exposes a portion of the cover layer 50 aligned over the metal pad 40, as shown in FIG. 1. A further exposure is performed without using a mask on the developed photoresist layer for destroying the functionalities of photoactive compounds in the photoresist material. The further exposure of the developed photoresist layer is to prevent the photoactive compounds in the photoresist material from polymerization during the subsequent etching process.

Subsequently, the in-process substrate is cured at 120° C. and then the exposed cover layer is etched to expose the metal pad. The polymers generated in the reaction of the plasma and the material of the cover layer on the sidewall of the pad opening and the cured photoresist material during the etching process are removed by low-power plasma. The photoresist material is then removed by solvents, for example, by a developer such as tetramethyl amino hydroxide (TMAH) solution or by an amine base solvent, such as ethanolamine.

In accordance with the present process of removal of photoresist material on the cover layer in manufacturing a CMOS photosensor, the photoresist material can be completely removed with no damage to the cover layer on the in-process substrate so that the transmission of light is not interrupted.

Therefore, a CMOS photosensor with improved photosensitivity can be manufactured in accordance with the process of the present invention.

While the invention has been particularly shown and described with reference to the preferred embodiment but not limited thereto, it is realized that other modifications and changes will be apparent to those skilled in the art. It is therefore to be understood that the appended claims are intended to cover all modifications and changes as fall within the true spirit and scope of the invention.

What is claimed is:

1. A process for removing photoresist material on an in-process substrate, comprising the steps of:
    providing an organic transparent layer which is to be etched on the in-process substrate;
    providing a layer of photoresist material on the organic transparent layer;
    performing a first exposure step and a developing step on the photoresist layer, so that the remaining photoresist layer has a pattern that exposes a portion of the organic transparent layer;
    performing a second exposure step on the whole remaining developed photoresist layer without using a mask after the developing step;
    performing a dry-etching on the exposed cover layer with the use of the remaining photoresist layer as a mask; and
    removing the remaining photoresist layer by a solvent.

2. The process as claimed in claim 1, wherein a material of the organic transparent layer includes polyacrylate.

3. The process as claimed in claim 1, further comprising after further exposing the developed photoresist layer, the step of curing the in-process substrate.

4. The process as claimed in claim 3, wherein the temperature for curing the in-process substrate is about 120° C.

5. The process as claimed in claim 1, wherein the photoresist layer is treated by low-power plasma before removal thereof.

6. The process as claimed in claim 1, wherein the photoresist layer is a positive photoresist layer.

7. The process as claimed in claim 1, wherein the solvent for removal of the photoresist layer includes developer.

8. The process as claimed in claim 7, wherein the developer is sulfate.

9. A process for manufacturing a CMOS photosensor with an in-process substrate having a metal pad for a subsequently formed electric connect, wherein the photoresist material on the in-process substrate is to be removed, the process comprising the steps of:
    providing a cover layer on the in-process substrate, wherein the cover layer comprises a filtering layer for transmitting a light with a certain wavelength and is covered with a protective layer;
    providing a layer of photoresist material on the cover layer;
    patterning the layer of photoresist material, so that a portion of the cover layer is exposed, the patterning step comprising a first exposure step;
    performing a second exposure step on the patterned layer of photoresist material without using a mask, so that functionalities of photoactive compounds in the patterned layer of photoresist material are destroyed;
    performing a dry-etching on the exposed cover layer with the use of the patterned layer of photoresist material as a mask to form an opening exposing the metal pad; and
    removing the photoresist material by a solvent.

10. The process as claimed in claim 9, wherein a material of the protective layer is polyacrylate.

11. The process as claimed in claim 9, wherein the photoresist layer is treated by low-power plasma before removal thereof.

12. The process as claimed in claim 9, wherein the photoresist layer is a positive photoresist layer.

13. The process as claimed in claim 9, further comprising after further exposing the developed photoresist layer, the step of curing the in-process substrate.

14. The process as claimed in claim 13, wherein the temperature for curing the in-process substrate is about 120° C.

15. The process as claimed in claim 9, wherein the solvent for removal of photoresist material is developer.

16. The process as claimed in claim 15, wherein the developer is sulfate.

17. A process for removing photoresist material on an in-process substrate, sequentially comprising the steps of:
    providing a cover layer which is to be etched on the in-process substrate;
    providing a layer of photoresist material on the cover layer;
    performing a first exposure step and a developing step on the photoresist layer, so that the remaining photoresist layer has a pattern that exposes a portion of the cover layer;
    performing a second exposure step on the whole remaining developed photoresist layer without using a mask after the developing step, wherein the second exposure is performed to prepare the remaining developed photoresist layer for being entirely removed;
    performing a dry-etching on the exposed cover layer with the use of the pattern of the remaining photoresist layer as a pattern mask; and
    removing the remaining photoresist layer by a solvent.

18. A process for removing photoresist material on an in-process substrate without residues, comprising the steps of:
    providing a cover layer which is to be etched on the in-process substrate;
    providing a layer of positive photoresist material on the cover layer;
    performing a first exposure step and a developing step on the photoresist layer, so that the remaining positive photoresist layer exposes a portion of the cover layer;
    performing a second exposure step on the whole remaining developed positive photoresist layer without using a mask after the developing step;
    performing a dry-etching on the exposed cover layer with the use of the remaining positive photoresist layer as a mask; and
    removing the remaining positive photoresist layer, wherein the removal of the remaining positive photoresist layer is performed by performing the second exposure on the whole remaining developed positive photoresist layer without using a mask and by subsequently immersing the developed positive photoresist layer in a solvent.

* * * * *